United States Patent [19]

Sung et al.

[11] Patent Number: 5,734,607
[45] Date of Patent: Mar. 31, 1998

[54] METHOD OF MANUFACTURING SELF-ALIGNED BIT-LINE AND DEVICE MANUFACTURED THERBY

[75] Inventors: Hung-Cheng Sung, Hsin-Chu, Taiwan; Ling Chen, Sunnyvale, Calif.

[73] Assignee: Taiwan Semiconductor Manufacturing Company Ltd., Hsin-Chu, Taiwan

[21] Appl. No.: 688,069

[22] Filed: Jul. 29, 1996

Related U.S. Application Data

[62] Division of Ser. No. 562,868, Nov. 27, 1995, Pat. No. 5,589,413.
[51] Int. Cl.⁶ ................................ H01L 23/58
[52] U.S. Cl. .............. 365/185.01; 257/314; 257/315; 257/316
[58] Field of Search ............ 365/185.01, 185.33; 257/314, 315, 316, 317, 318

[56] References Cited

U.S. PATENT DOCUMENTS

| | | | |
|---|---|---|---|
| 5,204,286 | 4/1993 | Doan | 437/195 |
| 5,231,051 | 7/1993 | Baldi et al. | 437/187 |
| 5,260,894 | 11/1993 | Noda | 257/316 |
| 5,559,735 | 9/1996 | Ono et al. | 257/315 |
| 5,641,989 | 6/1997 | Tomioka | 257/316 |

*Primary Examiner*—Vu A. Le
*Attorney, Agent, or Firm*—George O. Saile; Stephen B. Ackerman; Graham S. Jones, II

[57] ABSTRACT

An integrated circuit EPROM memory device includes devices to which electrical connections are to be made. A tunnel oxide layer on a semiconductor substrate carries an array of gate stacks with sidewalls with trench spaces therebetween comprising wider drain trench spaces and narrower source trench spaces down to the tunnel oxide layer. Gate stacks include a doped polysilicon floating gate over the tunnel oxide layer, a dielectric layer over the floating gate, a polysilicon control gate over the dielectric layer covered by a silicon dioxide dielectric layer and a silicon nitride layer. Source/drain regions lie between the stacks with alternating source regions and drain regions below the trench spaces between the sidewalls. Spacers are adjacent to the sidewalls of the drain trench spaces. Spacer dielectric plugs fill source trench spaces. A blanket dielectric layer overlies the stacks and the spacer dielectric plugs. Bitlines extend across the stacks into contact with the drain regions through the drain trench spaces. The memory devices include a self-aligned bitline structure formed simultaneously with electrical contacts to the drains.

17 Claims, 6 Drawing Sheets

METHOD OF MANUFACTURING SELF-ALIGNED BIT-LINE AND DEVICE MANUFACTURED THERBY

This application is a divisional application of Ser. No. 08/562,868 filed on Nov. 27, 1995, U.S. Pat. No. 5,589,413.

BACKGROUND OF THE INVENTION

1. Field of the Invention

This invention relates to semiconductor devices and more particularly to connection of bit-lines in memory devices.

2. Description of Related Art

U.S. Pat. No. 5,204,286 of Doan for "Method of Making Self-Aligned Contacts and Vertical Interconnects to Integrated Circuits" and U.S. Pat. No. 5,231,051 of Baldi et al for "Method for Formation of Contact Plugs Utilizing Etchback" show use of deposits of tungsten which are etched back to form contacts.

In a conventional EPROM (Flash) layout, first there is a rule that there must be extra polysilicon to contact space of about 0.4 μm of space required.

Secondly, a bit-line metal to contact overlap of about 0.2 μm requires provision of a safe dimensional margin because of the high probability of misalignment of the bit-line with the contact. Both of these design rules will limit the ability to shrink (reduce the dimensions of) EPROM (Flash) memory devices.

SUMMARY OF THE INVENTION

By applying a self-aligned bit-line structure in accordance with this invention, contacts and bit-lines can be formed at one time without any misalignment concern, resulting in a savings in area on the order of about 26%.

In accordance with this invention, EPROM integrated circuit memory devices are provided with self-aligned bit-lines. Furthermore a method for manufacturing the devices if provided which comprises the steps of:

providing a semiconductor substrate having devices therein to which electrical connections are to be made, forming a tunnel oxide layer on the substrate, forming a blanket, doped, polysilicon layer over the tunnel oxide layer on the substrate, forming an interelectrode dielectric layer over the blanket, doped, polysilicon layer, forming a blanket polycide layer over the interelectrode dielectric layer, forming a silicon dioxide dielectric layer over the blanket polycide layer the silicon dioxide layer comprises a TEOS (tetraethylorthosilicate) dielectric layer at a temperature between about 650° and 750° C. in an LPCVD reactor by decomposing tetraethoxysilane, $Si(OC_2H_5)_4$ vaporized from a liquid source producing a complex mixture of organic and organosilicon compounds above the blanket polycide layer, forming a silicon nitride ($Si_3N_4$) layer over the silicon dioxide layer, forming a source/drain mask over the silicon nitride layer with source/drain trench openings therein the source trench openings being substantially more narrow than the drain trench openings, etching in a self-aligned source and drain etching process to form EPROM gate electrode stacks with trench spaces between the stacks in an array of the stacks, the stacks being formed by the silicon nitride ($Si_3N_4$) layer, the silicon dioxide dielectric layer, the polycide layer, the interelectrode dielectric layer, and the polysilicon layer down to the tunnel oxide layer, the stacks having sidewalls with the trench spaces therebetween, the trench spaces between the sidewalls including source trench spaces over the source regions and drain trench spaces over the drain regions, the source trench spaces being substantially more narrow than the drain trench spaces, ion implantation of source/drain dopant ions with an MDD N+ ion implanting process between the stacks forming alternating source regions and drain regions below the spaces between the sidewalls, forming spacer dielectric structures adjacent to the sidewalls over the drain regions leaving narrow drain spaces therebetween and spacer dielectric plugs completely filling the spaces over the source regions, performing an additional N+ implant between the spacers into the drain regions, forming a blanket dielectric layer over the stacks, the spaces and the sidewalls, the blanket dielectric layer comprising BPTEOS, etching drain bit-line openings down to the drain regions drain regions through the blanket dielectric layer and the tunnel oxide layer over the drain regions between the spacers, forming a barrier metal layer of titanium/titanium nitride over the exposed surfaces of the drain regions, forming a conductive metal blanket layer over the device extending down into contact with the drain regions through the bit-line openings, etching back the conductive metal layer leaving the bit-lines extending across the device and down into contact with the drain regions. The EPROM memory devices include a self-aligned bit-line structure formed simultaneously with electrical contacts to the drain electrodes.

Preferably, the blanket dielectric layer comprises BPTEOS; the etching of the blanket layer of conductive metal blanket is performed at a pressure of about 100 mTorr in a preferred gas mixture of $C_4F_8/CF_4/CO/Ar$ flowing at relative flow rates of 5/10/200/600 sccm at an energy level of 1,000 watts; the BPTEOS layer has a thickness between about 3,000 Å and about 4,000 Å; the interelectrode dielectric layer comprises ONO; the conductive metal blanket layer comprises tungsten; the silicon dioxide layer comprises a TEOS (tetraethylorthosilicate) dielectric layer formed at a temperature between about 650° and 750° C. in an LPCVD reactor by decomposing tetraethoxysilane, $Si(OC_2H_5)_4$ vaporized from a liquid source producing a complex mixture of organic and organosilicon compounds above the blanket polycide layer; and/or the source region and the drain region are formed with an MDD ion implanting process.

BRIEF DESCRIPTION OF THE DRAWINGS

The foregoing and other aspects and advantages of this invention are explained and described below with reference to the accompanying drawings, in which:

FIG. 1A is a section taken along line 1A—1A in FIG. 1B.

FIG. 2C is a section taken along line 2C—2C in FIG. 2D.

DESCRIPTION OF THE PREFERRED EMBODIMENT

This invention employs a self-aligned bit-line structure and a method whereby contacts and self-aligned bit-lines can be formed at one time without any misalignment concern, resulting in a savings in area on the order of about 26%.

Figure 1A:
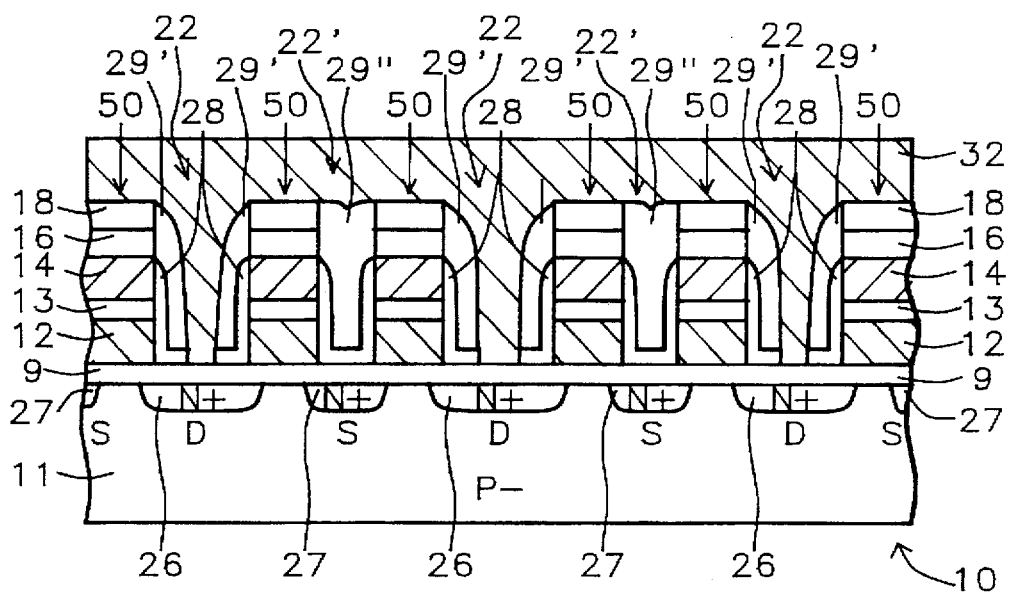
FIG. 1A shows an EPROM (Flash) memory device in accordance with this invention formed on a P- lightly doped silicon, lightly doped P-semiconductor substrate upon which a tunnel oxide layer has been formed.

FIG. 1A shows an EPROM (Flash) memory device 10 formed on a P- lightly doped silicon, lightly doped P-semiconductor substrate 11 upon which a tunnel oxide layer 9 has been formed. Over tunnel oxide layer 9 are formed spaced multilayer stacks 50 (see FIG. 2C) of floating gate electrode 12, control gate electrode 14 and dielectric layers 13, 16, and 18 with unequal alternately narrower and broader spaces (spaces comprising trench openings 22 and 22' seen in FIG. 2C) therebetween, with broader drain spaces (22) alternating with narrower source spaces (22').

Each stack 50 includes a floating gate electrode 12, preferably formed from a doped polysilicon layer. Floating gate electrode preferably has a thickness of between about 1,300 Å and about 1,500 Å. Above floating gate electrode layer 12 is a conventional interelectrode dielectric layer 13, over which is formed a control gate electrode 14, preferably formed from a laminated doped polycide layer (tungsten silicide with a thickness of between about 1,000 Å and about 2,000 Å and a second layer of polysilicon with a thickness of between about 1,000 Å and about 2,000 Å.) Control gate electrode 14 preferably has a thickness of between about 1,500 Å and about 2,000 Å. The interelectrode dielectric layer 13 (preferably having a thickness of between about 250 Å and about 300 Å) is preferably composed of a conventional ONO (silicon dioxide/silicon nitride/silicon dioxide) multilayer dielectric insulator.

Figure 2A:
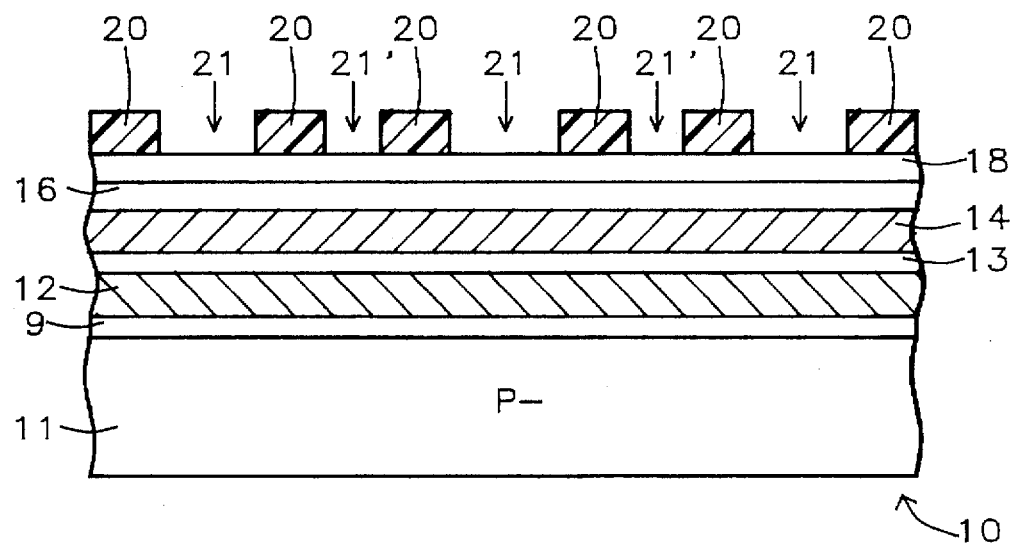
FIG. 2A illustrates the early stages of forming an EPROM (Flash) memory device in accordance with this invention on a P- lightly doped silicon semiconductor substrate having a substantially planar top surface upon which a tunnel oxide layer has been formed.
Figure 2B:
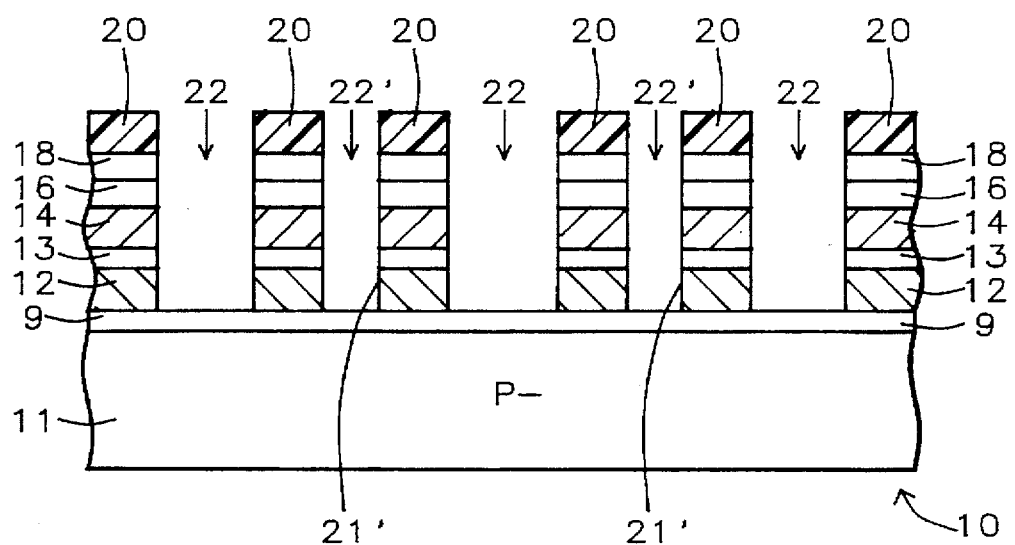
FIG. 2B shows the device of FIG. 2A after etching of trench openings down through several layers to the surface of substrate in a SAS (Self-Aligned Source) etch.
Figure 2C:
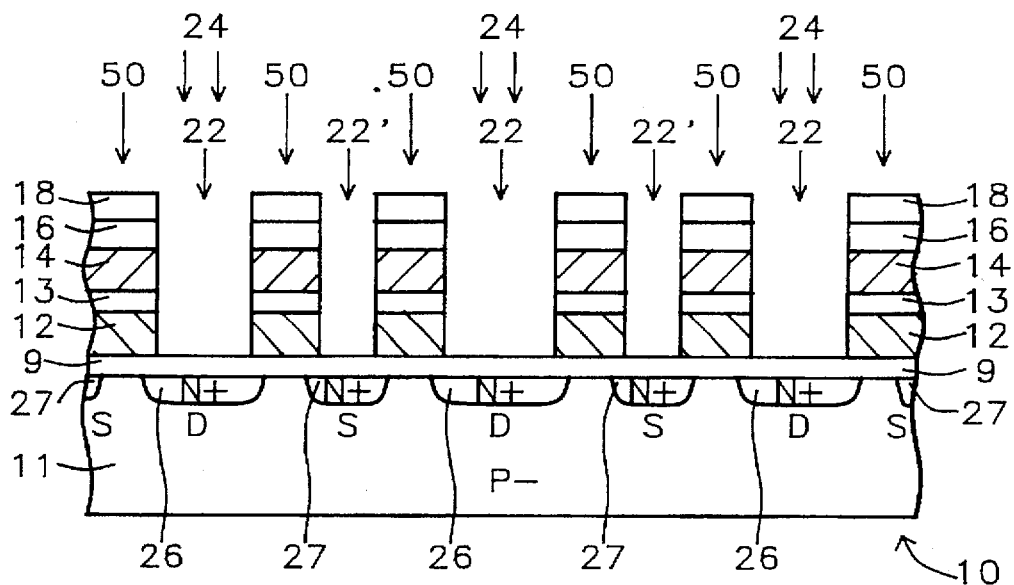
FIG. 2C shows the device of FIG. 2B after a step of ion implantation of arsenic of dopant ions through trench openings into the regions in an MDD (Medium Dosage Drain) implant.
Figure 2D:
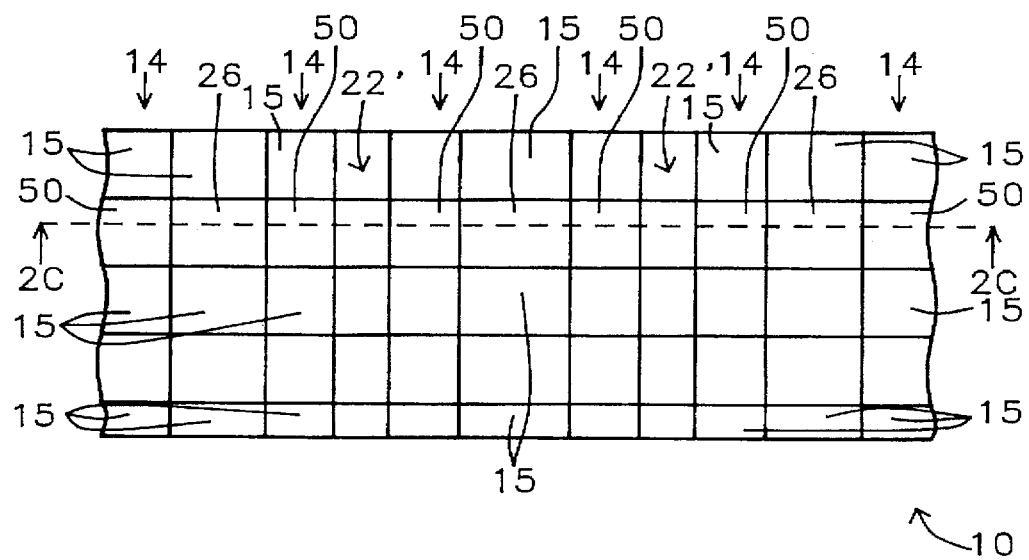
FIG. 2D is a plan view of the device of FIG. 2C showing trench openings down to source regions of the device, with field oxide (FOX) regions above and below the section line 2C—2C.
Figure 2E:
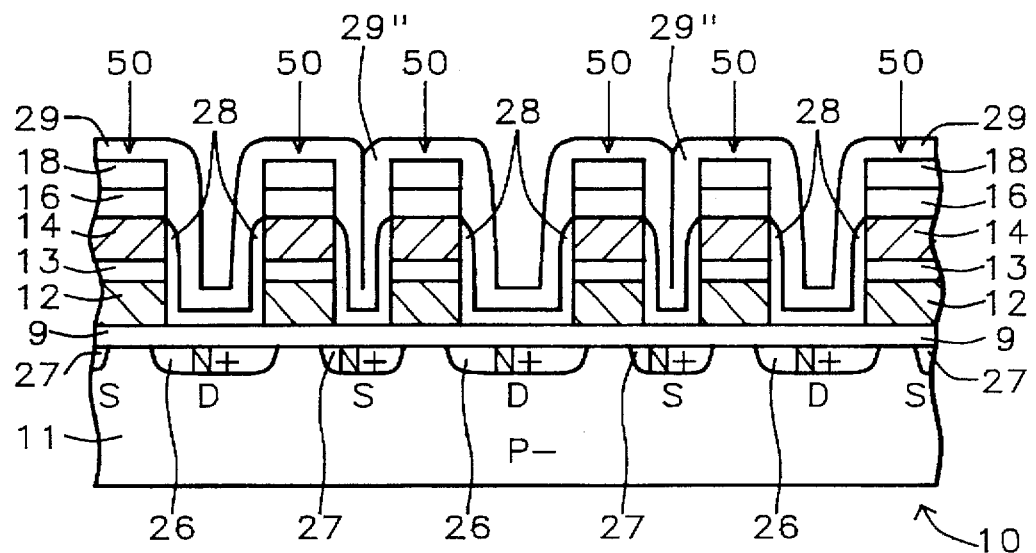
FIG. 2E shows the device of FIG. 2C after the formation of very thin oxidized sidewalls within spaces formed by trench openings on the exposed surfaces of a polysilicon layer, ONO dielectric layer, and a polycide layer. Oxidized sidewalls are formed.
Figure 2F:
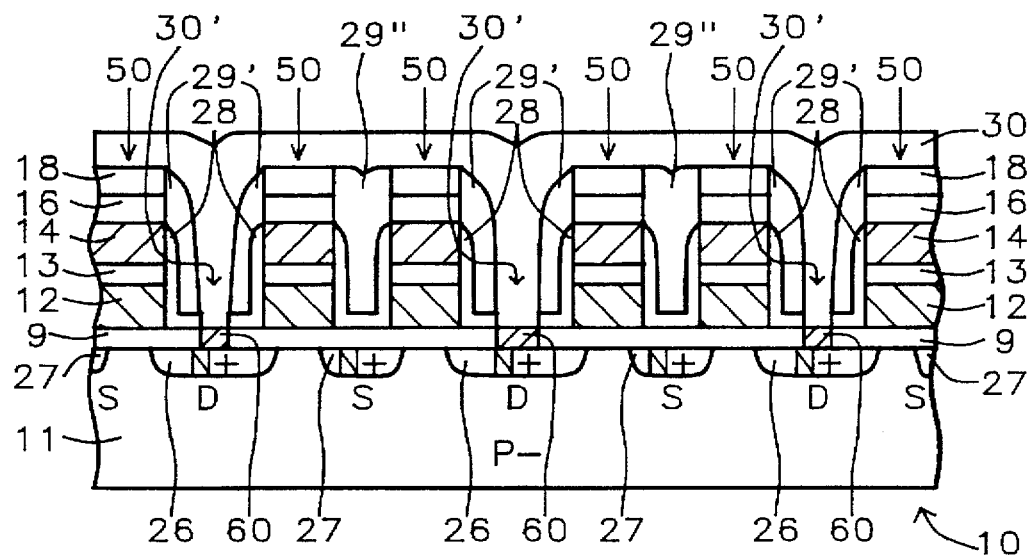
FIG. 2F shows the device of FIG. 2E after the blanket deposition over device of a BPTEOS layer.
Figure 2G:
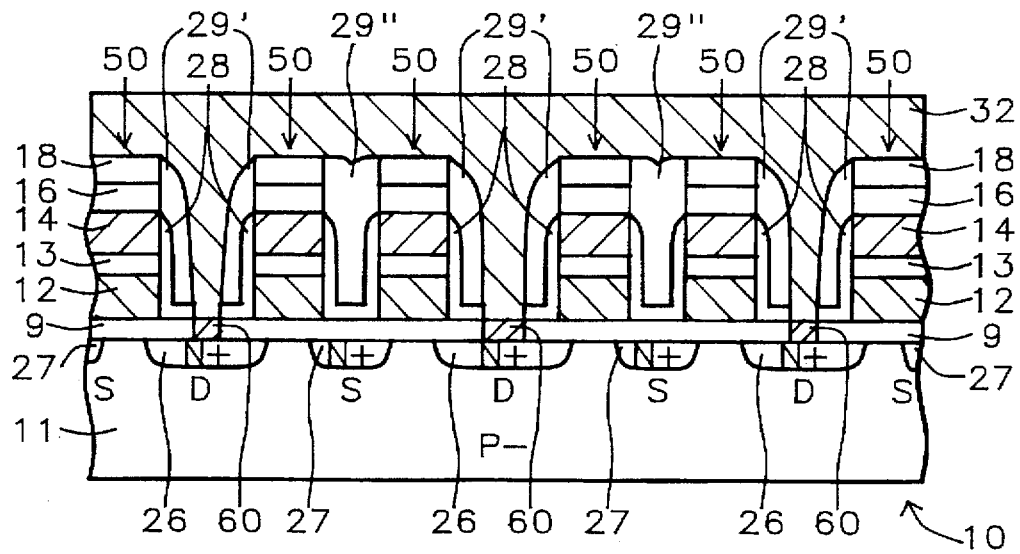
FIG. 2G shows the device of FIG. 2F after electrically conductive tungsten metal bit-lines are formed reaching across stacks and reaching down between spacers into electrical and mechanical contact with the drain regions.
Figure 2H:
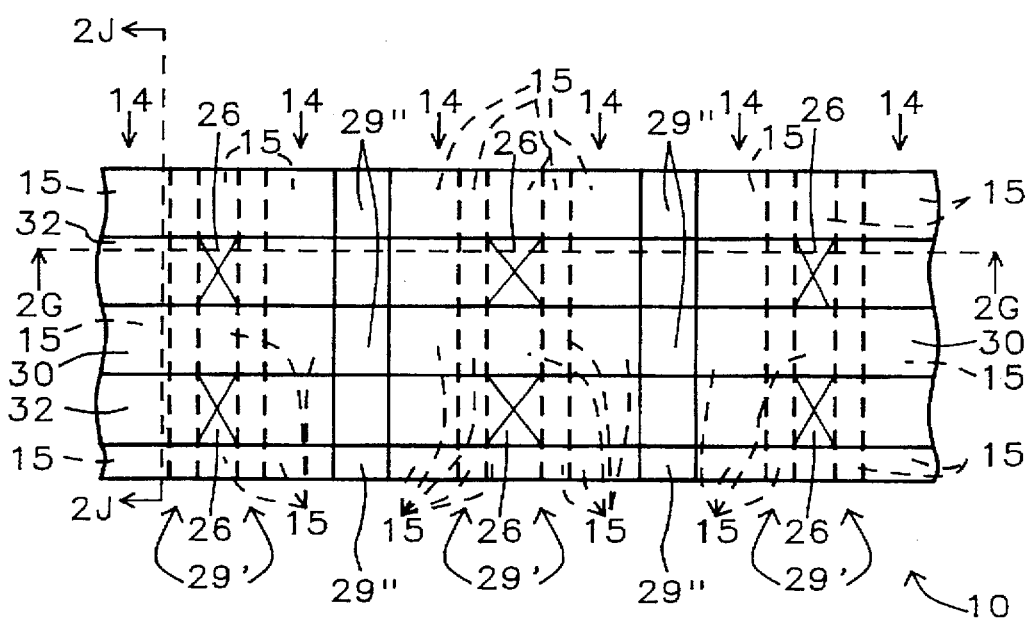
FIG. 2I is a section taken along line 2I—2I in FIG. 2H wherein the FOX regions are shown formed on the surface of the substrate separated by the plugs formed in spaces formed by trench openings over the source regions. Above the FOX regions are formed the ONO layers covered by the polycide layer and TEOS dielectric layer and a silicon nitride ($Si_3N_4$) layer which is covered by a BPTEOS layer.
FIG. 2J shows the substrate covered by an array of FOX regions spaced an equal distance apart, separated by silicon dioxide regions formed on the surface of the substrate. Over gate oxide regions and over portions of FOX regions between the FOX regions is a polysilicon layer covered with an ONO dielectric layer above which is a polycide layer which extends across the tops of all of the FOX regions, as well. In turn, the silicon nitride ($Si_3N_4$) layer is covered by a BPTEOS layer.
Figure 2I:
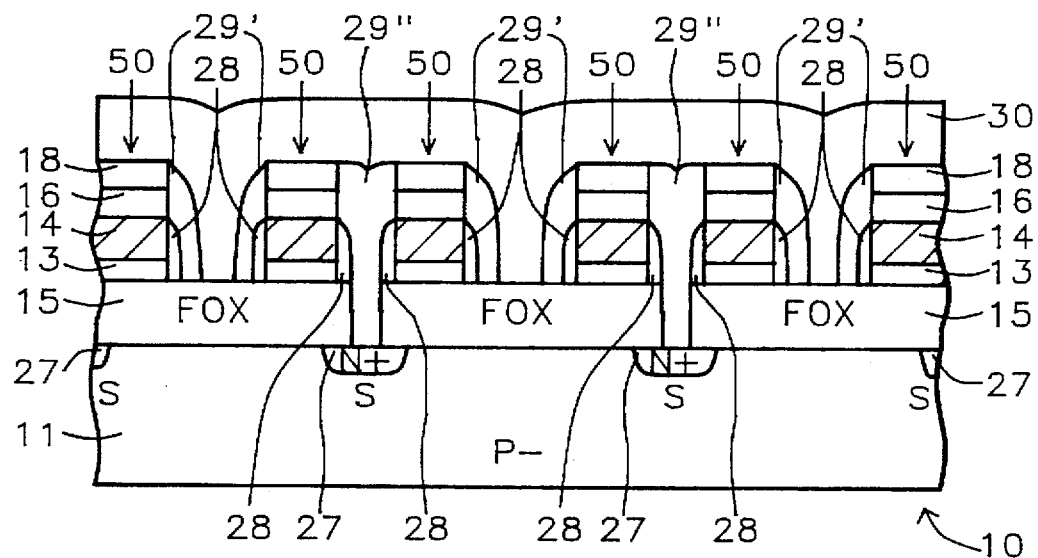

A self-aligned source (SAS) etching process is performed after the definition of the gates to form a continuous source line 27 as illustrated in FIG. 2I according to the process described in Tang et al U.S. Pat. No. 5,103,274 for "Self-Aligned Source Process and Apparatus."

Then, above control gate electrode 14, a silicon dioxide TEOS (tetraethylorthosilicate) dielectric layer 16 is formed (preferably having a thickness of between about 1,500 Å and about 2,000 Å.) A silicon nitride ($Si_3N_4$) layer 18 (preferably having a thickness of between about 800 Å and about 1,000 Å) is formed over the TEOS glass layer 16.

In substrate 11, between the stacks 50 are formed MDD ion implanted drain regions 26 and source regions 27 with a concentration of implanted ions between about $1\times10^{15}$ atoms/cm$^3$ and about $1\times10^{15}$ atoms/cm$^3$.

On the sidewalls facing trench openings 22 and 22' of floating gate electrode 12, ONO layer 13, and control gate electrode 14 are formed oxidized sidewalls 28. The oxidized sidewalls 28 are formed within spaces formed by trench openings 22 and 22' on exposed surfaces of polysilicon layer 12, ONO dielectric layer 13, and control gate polycide layer 14. Oxidized sidewalls 28 are formed preferably with a thickness between about 100 Å and about 200 Å.

Within wide spaces formed by trench openings 22 (above the drain regions 26) are formed $Si_3N_4$ spacers 29' (preferably with a thickness between about 2,000 Å and about 3,000 Å) adjacent to the oxidized sidewalls 28 of the floating gate electrode 12 and control gate electrode 14 and over the edges of TEOS dielectric layer 16 and silicon nitride ($Si_3N_4$) layer 18.

On the other hand within narrow spaces formed by trench openings 22', silicon nitride ($Si_3N_4$) layer plugs 29" are formed above the source regions 27, between the stacks of floating gates 12, ONO layer 13 and control gates 14. The plugs 29" completely fill the space between the oxidized sidewalls 28 and the stacks 50 and above the source regions 27. The source regions 27 are purposely so narrow that the space between the gates is filled to the top, without a valley, by $Si_3N_4$ layer deposition plugs 29". The drain regions 26 are wider than the narrow source regions 27.

After formation of the spacers 29', there is an N+ implant of arsenic as described below in in more detail with reference to FIG. 2F.

A planarized BPTEOS layer 30 (seen in an late phase after patterning thereof in FIG. 2F) with a thickness between about 3,000 Å and about 4,000 Å (which cannot be seen in the section shown in FIG. 1A, but can be seen in the plan view seen in FIG. 1B as well as FIG. 2H which is very similar to FIG. 1B) has been formed over the device 10. The BPTEOS layer 30 with a preferred thickness between about 9,000 Å and about 11,000 Å was then etched back to planarize the layer 30 for layers supported thereon.

Openings down to the drains have been opened in the layer 30 etching through the tunnel oxide 9 to the surface of the drain regions 26.

Next, a barrier layers 60 of titanium/titanium nitride with thicknesses of 400 Å/1,000 Å was deposited on the exposed surfaces of the drain regions before sputtering of tungsten.

Figure 1B:
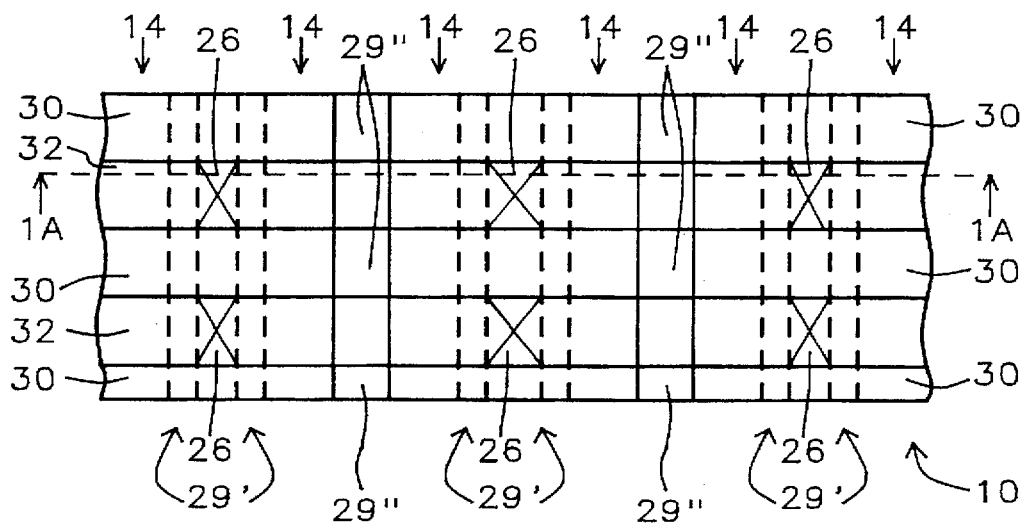
FIG. 1B shows a plan view of the device of FIG. 1A.

Referring to FIG. 2G, the device of FIG. 2F is shown after electrically conductive, tungsten metal, self-aligned bit-lines 32 are formed reaching across stacks 50 and reaching down between spacers 29' into electrical and mechanical contact with the titanium/titanium nitride barrier layers 60 over the surfaces of drain regions 26. Preferably, a tungsten bit-line layer 32 with a preferred thickness between about 6,000 Å and about 8,000 Å is deposited as a blanket tungsten layer. Then the blanket tungsten layer is etched-back to provide the tungsten bit-lines 32 in accordance with the two parallel bit-line patterns 32, as seen in FIG. 1B.

In FIG. 1B, the location of spacers 29' is seen as indicated by phantom (dotted) lines. The location of the contacts with drain regions 26 below is indicated by X markings. The plugs 29" over the source regions 27 are marked as the white areas. The metal bit-lines 32 which contact the drains 26 bridge cross over the top surfaces of plugs 29" which cover the source regions 27, as shown in FIG. 1A.

Figure 2J:
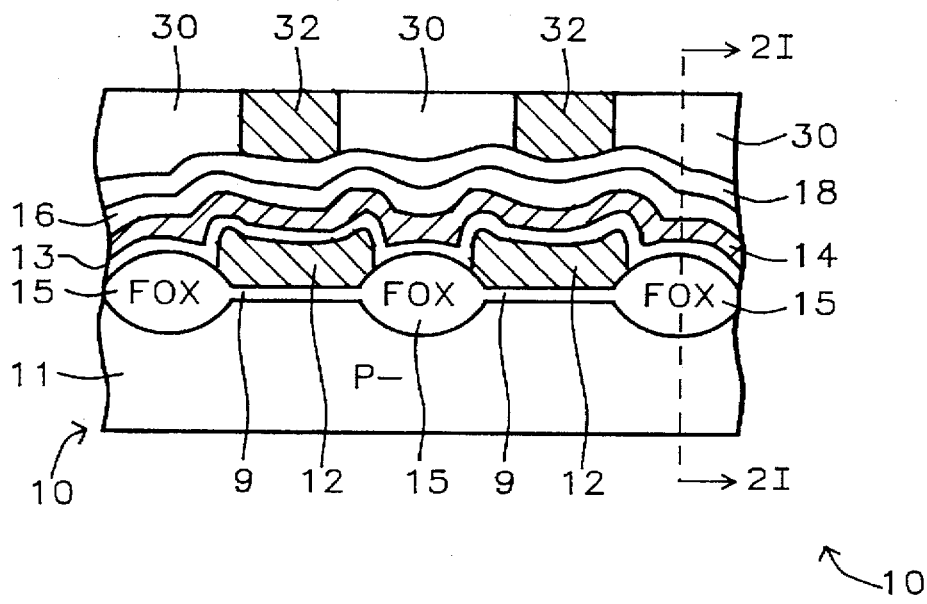

Referring to FIG. 2J, some portions of the substrate 11 which are not seen in FIG. 1A are covered by an array of FOX regions 15, spaced equal distances apart, separated by tunnel oxide silicon dioxide regions 9 formed on the surface of layer 11. Between the FOX regions 15, are floating gate electrodes 12. Next a blanket layer of ONO interelectrode dielectric layer 13 covers the device 11. Above layer 13 is the control gate layer 14 which extends across the tops of all of the FOX regions 15, as well. A TEOS (tetraethylorthosilicate) dielectric layer 16 is formed over the control gate layer 14. In turn, the silicon nitride ($Si_3N_4$) layer 18 is covered by a BPTEOS layer 30.

Method of Manufacturing Self-aligned Bit-line

FIG. 2A illustrates the early stages of forming an EPROM (Flash) memory device 10 on a P- lightly doped silicon semiconductor substrate 11 having a substantially planar top surface upon which a tunnel oxide layer 9 has been formed. A polysilicon layer 12 composed of a doped polysilicon layer (adapted for use to form floating gate electrodes) is formed on top of the tunnel oxide layer 9. Above the first gate electrode layer 12, a conventional ONO dielectric layer 13 has been deposited. Above ONO dielectric layer 13, is formed a the polycide, control gate layer 14 (adapted to form control gate electrodes.)

The polysilicon (P1) layer floating gate layer 12 comprises heavily doped layers of polysilicon formed by either thermal reduction of $SiHCl_3$ (or dichlorosilane $SiH_2Cl_2$) in hydrogen or by thermal decomposition of silane $SiH_4$ in a reactor between about 600° C. and 650° C. at 0.2 to 1.0 Torr using 100% silane or a diluted mixture of 20–30% silane in nitrogen at about the same pressure. Above the layer 12, the polycide layer 14 is formed by a conventional process producing a laminated polycide layer 14 composed tungsten silicide with a thickness of between about 1,000 Å and about 2,000 Å covered with a layer of polysilicon with a thickness of between about 1,000 Å and about 2,000 Å.

Then above the blanket polycide layer 14, a silicon dioxide TEOS (tetraethylorthosilicate) dielectric layer 16 has been deposited between about 650° and 750° C. in an LPCVD reactor by decomposing tetraethoxysilane, $Si(OC_2H_5)_4$ vaporized from a liquid source producing a complex mixture of organic and organosilicon compounds.

Then a silicon nitride ($Si_3N_4$) layer 18 is deposited in a blanket layer over the TEOS glass layer 16.

Above the silicon nitride ($Si_3N_4$) layer 18, a photoresist mask 20 has been formed with trench openings 21 and 21' therein respectively above the regions below where drain and source regions 27 are formed in the device 10, as shown in FIG. 1A.

FIG. 2B shows the device of FIG. 2A after etching of trench openings 22 and 22' down through the layers 18, 16, 14, 13 and 12 to the surface of substrate 11 in a SAS (Self-Aligned Source) etch as described above with reference to Tang et al U.S. Pat. No. 5,103,274 for "Self-Aligned Source Process and Apparatus."

FIG. 2C shows the device of FIG. 2B after a step of ion implantation of arsenic of dopant ions 24 through trench openings 22 and 22' into the regions 26 and 27 in an MDD (Medium Dosage Drain) implant at an energy of between about 50 keV and about 80 keV with a dose between about $1\times10^{15}$ ions/cm$^2$ and about $5\times10^{15}$ ions/cm$^2$.

The purpose of the MDD implant is to form a heavy junction. Thus, the electric field can be stronger near the drain edge.

Preferably ion implanting of arsenic dopant is performed yielding doped source regions 27 and drain regions 26 in substrate 11. The arsenic dopant is implanted with a concentration between about $1\times10^{20}$ atoms/cm$^3$ and about $1\times10^{21}$ atoms/cm$^3$.

Preferably, the arsenic ions 24 are ion implanted with a dose of between about $1\times10^{15}$ ions/cm$^2$ and about $5\times10^{15}$ ions/cm$^3$. The ions 24 are preferably implanted at an energy of between about 50 keV and about 80 keV in a medium energy implanter tool.

FIG. 2D is a plan view of the device of FIG. 2C. FIG. 2C is a section taken along line 2C—2C in FIG. 2D. FIG. 2D shows the trench openings 22 down to the sources 27. Field oxide (FOX) regions 15 are shown above and below the section line 2C—2C.

FIG. 2E shows the device of FIG. 2C after the formation of very thin oxidized sidewalls 28 within spaces formed by trench openings 22 and 22' on exposed surfaces of polysilicon layer 12, ONO dielectric layer 13, and polycide layer 14. Oxidized sidewalls 28 are formed by a conventional process with a thickness between about 100 Å and about 200 Å.

Later, a blanket silicon nitride ($Si_3N_4$) spacer/plug forming layer 29 is formed over the entire device 10 including the space within trench openings 22 between oxidized sidewalls 28 and stacks 50. Silicon nitride ($Si_3N_4$) layer 29 has a thickness between about 800 Å and about 1,000 Å. In the case of trench openings 22' which are narrower, having a width of between about 5,000 Å and about 9,000 Å, the silicon nitride ($Si_3N_4$) layer 29 fills the entire space in trench openings 22'.

Then layer 29 is etched back to form spacers 29', in trench openings 22 but not in trench openings 22'. The spacers 29' are formed by the subtractive or etching process adjacent to the oxidized sidewalls 28 of the floating gate electrodes 12 and control gate electrodes 14 and over the edges of TEOS dielectric layer 16 and silicon nitride ($Si_3N_4$) layer 18.

The layer 29 is etched back to form the spacers 29' by plasma etching with a gas of $SF_6$ at a pressure of about 400 mTorr.

After the etching of spacer layer 29, to form spacers 29', there is an N+ implant of arsenic implanted at an energy of between about 40 keV and about 80 keV with a dose between about $1\times10^{15}$ ions/cm$^2$ and about $5\times10^{15}$ ions/cm$^2$.

FIG. 2F shows the device of FIG. 2E after the blanket deposition over device 10 of a BPTEOS layer 30 with a thickness between about 8,000 Å and about 11,000 Å. Initially, a glass dielectric layer of BPTEOS (composed of Boron, Phosphorus, Tetraethylorthosilicate with a concentration of boron (B) between about 2.5 weight percent to about 5 weight percent) and with a concentration of phosphorous (P) between about 3 weight percent to about 5.5 weight percent). The BPTEOS layer is formed with a an APCVD (atmospheric pressure Chemical Vapor Deposition) tool selected from APCVD, PECVD, LPCVD (Low Pressure C.V.D.) which deposits BPTEOS. The typical BPTEOS composition comprises a boron-phosphorous SiO2 with boron 4 weight percent and phosphorous 4 weight percent.

The next step is to perform an etchback simply to planarize the BPTEOS dielectric layer 30.

Then a mask 31 is formed to etch the BPTEOS dielectric layer 30 in accordance with the pattern in the photoresist mask 31. The BPTEOS dielectric layer 30 is etched down to the surfaces of the drain regions 26, source regions 27 and spacers 29' forming several BPTEOS dielectric regions 30. The pattern of the mask 31 is seen in FIG. 2F and FIG. 2G.

Thus openings down 30' to the drains have been opened in the layer 30 etching through the tunnel oxide 9 to the surface of the drain regions 26. Layer 30 is seen in the background leaving spaces between for the metal bit-lines 32 to follow.

Next, before the metal bit-line layer 32 can be formed, a barrier layers 60 of titanium/titanium nitride with thicknesses of 400 Å/1,000 Å is deposited on the exposed surfaces of the drain regions 26 before sputtering of the blanket tungsten layer 32 seen in FIG. 2G.

FIG. 2H is a plan view of the device of FIG. 2G. FIG. 2G is a section taken along line 2G—2G in FIG. 2H, which extends down through the drain region 26 and the source region 27.

Next, a barrier layer of titanium/titanium nitride with thicknesses of 400 Å/1,000 Å is deposited on the exposed surfaces before sputtering of tungsten.

A blanket layer of tungsten bit-line material 32 is then deposited upon the exposed surfaces of device 10.

Then, the tungsten bit-line material 32 is etched-back to provide the tungsten bit-lines 32 in accordance with the two bit-line patterns seen in FIG. 2H.

A bit-line mask is formed to be used with selective etching of the tungsten through the openings in the mask in a plasma etching machine with a gas mixture of $C_4F_8/CF_4/CO/Ar$. The plasma etching machine and the recipe employed therein allows high selectivity of BPTEOS ($SiO_2$) and $Si_3N_4$ of about 28/1, so that $Si_3N_4$ spacers 29' are not significantly etched. The etching plasma process is performed at a pressure of about 100 mTorr at an energy level of 1,000 watts in a preferred gas mixture of $C_4F_8/CF_4/CO/Ar$ flowing at relative flow rates of 5/10/200/600 sccm.

In FIG. 2H, two of the newly formed self-aligned tungsten bit-lines 32 produced by the plasma etching process can be seen in plan view. In addition, the locations of the contacts of the bit-lines 32 with drain regions 26 below are indicated by X markings. The BPTEOS dielectric regions 30 are between the metal bit-lines 32. Self-aligned bit-lines 32 contact the drains 26 and cross over the stacks 50 bridging over the top surfaces of plugs 29" as shown in FIG. 2G.

FIG. 2I is a section taken along line 2I—2I in FIG. 2H. In FIG. 2I, the FOX regions 15 are shown formed on the surface of the substrate 11 separated by the plugs 29" formed in spaces formed by trench openings 22' over the source regions 27. Above the FOX regions 15 are formed the ONO layers 13 which are covered in turn by the polycide layer 14 and TEOS dielectric layer 16 and silicon nitride ($Si_3N_4$) layer 18, which in turn is covered by BPTEOS layer 30.

FIG. 2J shows the substrate covered by an array of FOX regions 15 spaced an equal distance apart, separated by silicon dioxide regions 9 formed on the surface of layer 11. Formed over silicon dioxide regions 9 and over portions of FOX regions 15, between the FOX regions 15, is polysilicon layer 12 covered with ONO dielectric layer 13. Above ONO layer 13 is polycide layer 14, which extends across the tops of all of the FOX regions 15, as well. In turn, the silicon nitride ($Si_3N_4$) layer 18 is covered by a BPTEOS layer 30.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. An integrated circuit EPROM memory device comprising:
    a semiconductor substrate having devices therein to which electrical connections are to be made,
    a tunnel oxide layer on said substrate,
    an array of gate electrode stacks formed on said tunnel oxide layer, said stacks having sidewalls with trench spaces therebetween down to said tunnel oxide layer, said trench spaces comprising wider drain trench spaces and narrower source trench spaces, said stacks having sidewalls,
    said gate electrode stacks including a doped polysilicon floating gate electrode over said tunnel oxide layer, an interelectrode dielectric layer over said floating gate electrode, a doped polysilicon control gate electrode over said interelectrode dielectric layer, a silicon dioxide dielectric layer over said control gate electrode, and a silicon nitride ($Si_3N_4$) layer over said silicon dioxide layer,
    ion implanted source/drain regions layer formed between said stacks with alternating source regions and drain regions below said trench spaces between said sidewalls,
    spacer dielectric structures adjacent to said sidewalls of said drain trench spaces,
    spacer dielectric plugs filling said source trench spaces,
    a blanket dielectric layer over said stacks and said spacer dielectric plugs,
    conductive metal bit-lines extending across said stacks and down into contact with said drain regions through said drain trench spaces,
    whereby said memory devices include a self-aligned bit-line structure formed simultaneously with electrical contacts to the drain electrodes.

2. A device in accordance with claim 1 wherein said blanket dielectric layer comprises BPTEOS.

3. A device in accordance with claim 1 wherein said BPTEOS layer has a thickness between about 3,000 Å and about 4,000 Å.

4. The device of claim 1 wherein said interelectrode dielectric layer comprises ONO.

5. The device of claim 1 wherein said conductive metal lines comprises tungsten.

6. The device of claim 1 wherein said silicon dioxide layer comprises a TEOS (tetraethylorthosilicate) dielectric layer above said blanket polycide layer.

7. The device of claim 2 wherein said BPTEOS layer has a thickness between about 3,000 Å and about 4,000 Å.

8. The device of claim 3 wherein said interelectrode dielectric layer comprises ONO.

9. The device of claim 4 wherein said conductive metal blanket layer comprises tungsten.

10. A device in accordance with claim 1 wherein said source regions and said drain regions comprise MDD ion implanted regions.

11. A device in accordance with claim 2 wherein said source regions and said drain regions comprise MDD ion implanted regions.

12. A device in accordance with claim 3 wherein said source regions and said drain regions comprise MDD ion implanted regions.

13. A device in accordance with claim 4 wherein said source regions and said drain regions comprise MDD ion implanted regions.

14. A device in accordance with claim 5 wherein said source regions and said drain regions comprise MDD ion implanted regions.

15. A device in accordance with claim 6 wherein said source regions and said drain regions comprise MDD ion implanted regions.

16. A device in accordance with claim 7 wherein said source regions and said drain regions comprise MDD ion implanted regions.

17. A device in accordance with claim 8 wherein said source regions and said drain regions comprise MDD ion implanted regions.

* * * * *